United States Patent [19]

Nagami

[11] Patent Number: 4,500,974
[45] Date of Patent: Feb. 19, 1985

[54] MEMORY CIRCUIT

[75] Inventor: Akira Nagami, Tokyo, Japan

[73] Assignee: Nippon Electric Co., Ltd., Tokyo, Japan

[21] Appl. No.: 428,517

[22] Filed: Sep. 29, 1982

[30] Foreign Application Priority Data

Sep. 29, 1981 [JP] Japan .................................. 56-154347

[51] Int. Cl.³ ............................................. G11C 11/40
[52] U.S. Cl. ..................................... 365/222; 365/210
[58] Field of Search ............... 365/222, 207, 189, 230, 365/174, 182, 210

[56] References Cited

U.S. PATENT DOCUMENTS

4,371,956  2/1983  Maeda et al. ...................... 365/222

Primary Examiner—Terrell W. Fears
Attorney, Agent, or Firm—Sughrue, Mion, Zinn, Macpeak & Seas

[57] ABSTRACT

A memory circuit capable of detecting that refresh operation is surely ended is disclosed. The memory circuit comprises a memory cell matrix, a dummy array sharing rows with the memory cell matrix and similar column structure to the memory cell matrix, and means coupled to a pair of digit lines of the dummy array for detecting that a potential at either of the pair of digit lines in the dummy array reaches an amplified low level.

8 Claims, 9 Drawing Figures

MEMORY CIRCUIT

The present invention relates to a memory circuit and more particularly, to a dynamic memory circuit making use of insulated gate field effect transistors.

While the dynamic random access memory (RAM) has been used in a wide variety of systems to effectively utilize its inherent properties of large-capacity and low-power operations, it is necessary to introduce refresh cycles normally at an interval of 2 ms for every refresh addresses for the purpose of preventing the contents stored in the memory cells from being lost by leakage. To that end, a refresh control circuit must be mounted on a board together with the memory, and hence, as compared to static memories the dynamic RAM has a difficulty that complexed timing control is additionally necessitated and an additional area in the device is further necessitated for the refresh control circuit. As the number of memories mounted on one board becomes small, naturally this shortcoming would become remarkable. In a small-scale system such as a microprocessor the proportion of area occupied by the circuit arrangement for the refresh control would be increased to a comparable extent to memories. Hence, the field of products of dynamic RAM's in which this refresh control can be effected on the same chip as a memory, has been developed, and such dynamic RAM is called Pseudo-Static (hereinafter abbreviated as PS) RAM. In such PSRAM, a terminal for incorporating a refresh control clock (hereinafter represented by $\overline{RFSH}$) is provided as an external terminal, and a refresh timing generator circuit and a refresh address counter circuit are disposed on the chip forming the dynamic RAM, so that if the $\overline{RFSH}$ is input under a predetermined condition, refresh can be automatically effected within the chip. Such RAM appears externally to be a static RAM, and from that reason it is called PSRAM. The PSRAM has an advantage that it has a large memory capacity that is characteristic of a dynamic RAM and yet complexed refresh control is externally unnecessary, that is, it can be handled equally to a static RAM.

In this PSRAM, an internal refresh cycle can be introduced by varying the $\overline{RFSH}$ from a high level to a low level. In the internal refresh cycle, memory contents in the memory cells aligned on a word line designated by a refresh address counter are refreshed. After the internal refresh has ended, when the operation shifts to an external access operation by changing a chip enable signal ($\overline{CE}$) to an active level, it is necessary to confirm the completion of the aforementioned internal refresh. To that end, when the internal refresh has ended, an internal refresh end confirmation signal (represented by RFEND) is generated, and it achieves this object.

With regard to a circuit for generating such refresh and confirmation signals, a circuit arrangement is proposed in "ISSCC DIGEST OF TECHNICAL PAPERS" February 1979, p. 144–145. In the signal generator circuit shown in this article, dummy digits are provided in a memory cell matrix, and the above-mentioned refresh end confirmation signal is generated by monitoring the levels of these dummy digits. However, this signal generator circuit could not detect the end of refresh of all the memory cells at all the refresh addresses, especially it could not exactly detect the end of refresh of both the memory cells having memory information represented by a higher potential and the memory cells having memory information represented by a lower potential. Consequently, in some cases the refresh would be interrupted under an insufficiently refreshed state, and in such cases in the next read operation, an operation margin of a read circuit such as a sense amplifier and the like would be narrowed, resulting in an erroneous operation.

It is one object of the present invention to provide a memory circuit which comprises means capable of detecting that refresh has surely ended and in which a malfunction would not occur.

Another object of the present invention is to provide a dynamic memory circuit having a large memory capacity and operating at a high speed.

In the memory circuit according to the present invention, a dummy array is provided to functional memory matrix. The memory matrix has a plurality of memory cells arrayed in rows and columns and a plurality of sense amplifiers each for the respective columns. Each of the columns has a pair of digit lines coupled to a pair of input terminals of the associated sense amplifier in known manner. The dummy array has a plurality of memory cells arrayed in rows and at least one dummy column and at least one sense amplifier associated to the dummy column. The rows of the dummy array are electrically connected to those of the memory matrix and the sense amplifier of the dummy array is simultaneously controlled with those of the memory matrix. The operation of the dummy array adequately simulates the operation of the memory matrix. A pair of digit lines of the dummy column are subject to detection operation in which establishment of a low level at either of the pair of digit lines in the dummy column is detected. In other words, completion of amplifying operation of the sense amplifiers is detected by such detection operation. Accordingly, completion of refresh operation can be surely detected.

According to one aspect of the present invention, there is provided a memory circuit comprising a cell matrix including dynamic type memory cells arrayed in M rows×N columns and N sense amplifier; a dummy digit column having cells arrayed in M rows×one dummy column and one sense amplifier, each of the columns and the dummy column including true and complement digit lines coupled to a pair of input terminal of the associated sense amplifier; means for simultaneously controlling the sense amplifiers; means coupled to both true and complementary digit lines of the dummy column for detecting that either one of the true and complementary digit lines of the dummy column has reached a sufficiently low level after activation of the sense amplifiers, and means responsive to such detection for shifting operation of the memory from the activation period to a precharge period.

The above-mentioned and other features and objects of the present invention will become more apparent by reference to the following description of preferred embodiments of the invention taken in conjunction with the accompanying drawings, wherein:

The following description of the preferred embodiments of the present invention will be made entirely with respect to the case where MOS transistors (hereinafter abbreviated as MOST's) which are representative of the insulated gate field effect transistors, especially N-channel MOST's are employed, and a high level is the logic "0" level, while a low level is the logic "0" level. However, even in the case of employing P-channel MOST's, the circuit arrangement itself is essentially the same.

Figure 1:
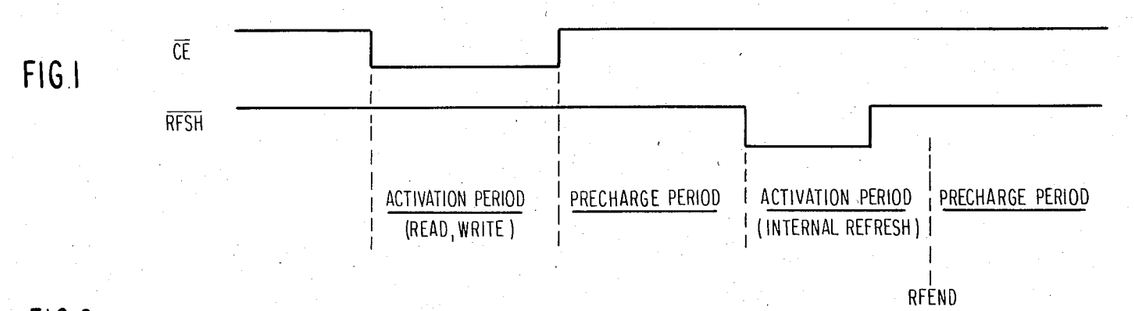
FIG. 1 shows input timing signals for effecting internal refresh within a PSRAM.

First, outline of the operation of the PSRAM will be explained with reference to FIG. 1. In response to change of a chip enable signal ($\overline{CE}$) from a high level to a low level, the operation enters an activation period, in which a write or read access operation is effected. After the desired access operation has finished, when the $\overline{CE}$ is returned to a high level that represents a standby state, the internal circuit is reset and the operation enters a precharge period. After completion of the precharge operation, the $\overline{RFSH}$ can be changed from a high level to a low level. In response to this level change, an internal refresh period is introduced, hence a refresh timing generator circuit operates to transmit the content of the refresh address counter to a row address inverter buffer, and at this moment, an external address input is disconnected from the row address inverter buffer. Subsequently, a basic clock generator circuit operates to achieve a series of operations until all the contents in the memory cells aligned on the word line designated by the refresh address counter have been refreshed. Then, as soon as the refresh operation is finished, an internal refresh end confirmation signal (RFEND) is generated, and at the same time, a function of automatically returning the memory circuit to a reset-precharge state by the internal circuit is required: This is necessary for the purpose of enhancing a freedom in timing of the $\overline{RFSH}$ input, and also for the purpose of power-down self-refresh in which if the $\overline{RFSH}$ is left at a low level for a long period, then refresh is effected automatically by a synchronizing action of a timer circuit provided internally. Accordingly, provided that this function is present, the timing when the $\overline{RFSH}$ is to be returned to a high level is not restricted so long as the low level period is sufficiently long. However, there is a limitation that the $\overline{RFSH}$ must be returned to a high level before the next activation of the $\overline{CE}$. In order to realize this function, the above-mentioned internal refresh end confirmation signal (RFEND) becomes necessary. Since the PSRAM is a product aiming at a microprocessor, the freedom of the input timing is strongly required, and the power-down operation is very effective in practical use thereof. In this means, the RFEND is the most important timing in the PSRAM.

Figure 2:
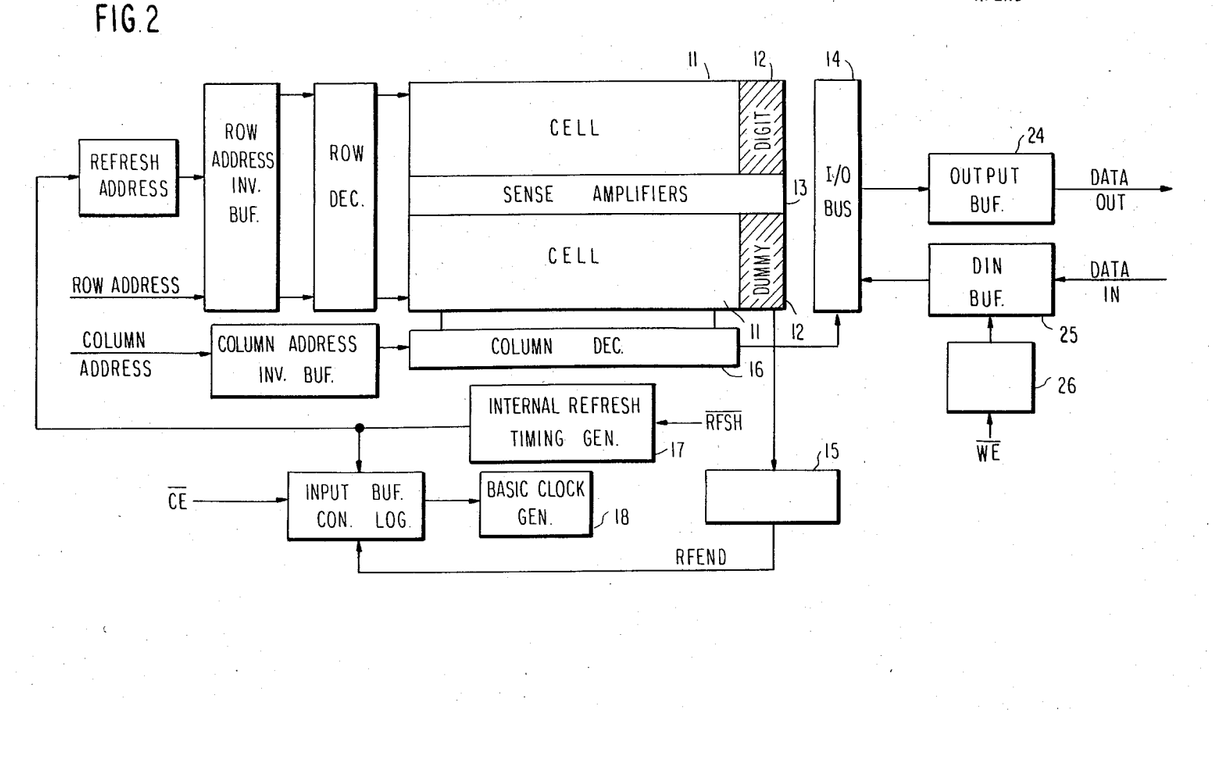
FIG. 2 shows a block diagram of a circuit of a PARAM.

The generating system of the RFEND is illustrated in FIG. 2, in relation to the block diagram of the overall circuit arrangement.

At one end of a cell block 11 are provided dummy digits 12 arranged in one column, and the RFEND is generated from a refresh end detector circuit 15 connected to these dummy digits 12. Assuming that the array of the memory cells is M rows × N columns, then the dummy digit column 12 is represented by M rows × one column, and while one set of sense amplifier 13 is provided similarly to another column, a column decoder 16 and an I/O bus 14 are not connected to the dummy digits 12.

In the memory circuit shown in FIG. 2, in a normal operation based on external access, in response to a chip enable signal $\overline{CE}$ input to an input buffer control logic circuit 19 changing to a low level, the memory circuit enters an activation period, and hence a basic clock generator circuit 18 is driven to generate a series of control clocks. These control clocks are applied to function circuits corresponding to a row address inverter buffer 21, a row decoder 22, a column address inverter buffer 23, a column decoder 16, an output buffer 24, an input buffer 25, etc., to control their operations. A row address input is taken in the row address inverter buffer 21, then the true and complementary signals of this intaken row address are decoded by the row decoder 22 to select one of M word lines in the cell block 11, and the contents in the memory cells on the selected row are amplified by a group of sense amplifiers 13. Among the N digit lines corresponding to the N columns of the memory cells to which the amplified data of the memory cells are applied, one digit line is selected by an output of the column decoder 16 to pass the data to an I/O bus 14, and the data are read out via the output buffer 24. At this moment, in the case of writing, in response to a write enable signal $\overline{WE}$ changing to a low level, a write clock circuit 26 is activated, hence the data input buffer 25 is activated by a write clock, so that input data are transmitted via the I/O bus 14 to the selected digit line, and thereby writing is effected.

Next, brief description will be made on a refresh operation. By changing the refresh control clock $\overline{RFSH}$ to a low level, an internal refresh timing generator circuit 17 is activated to apply a necessary output signal to the input buffer control logic circuit 19, thereby a refresh cycle is introduced and also a refresh address counter 20 is activated to apply its output to the row address inverter buffer 21 in place of the row address input, so that a word line designated by the refresh address counter 20 is selected and N memory cells connected to this selected word line are refreshed by the sense amplifier group 13. In response to a level change on the dummy digit column 12 as a result of achievement of the refresh, the RFEND is generated from the refresh end detector circuit 15. This RFEND is applied to the buffer control logic circuit 19 to shift the memory circuit into a reset precharge cycle. In addition, this RFEND can be used to control utilization of the memory circuit by applying the RFEND to a memory utilization circuit outside of the memory such as, for instance, a microprocessor or the like.

Figure 3:
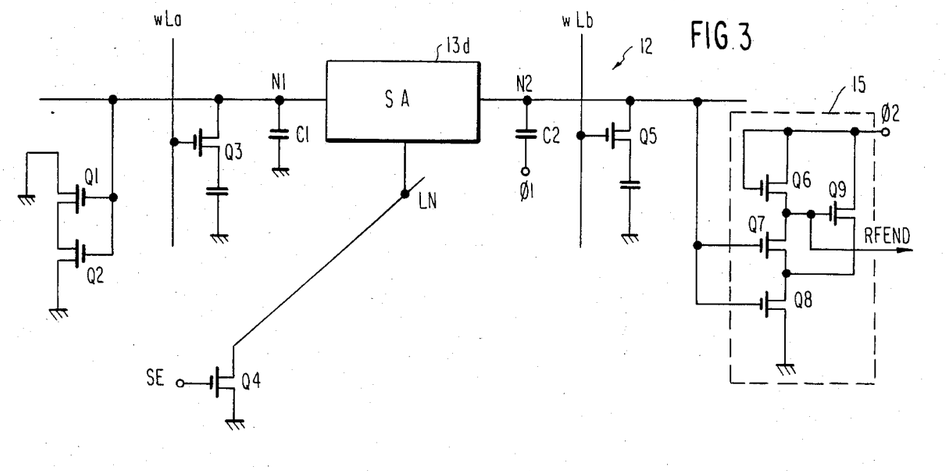
FIG. 3 shows a RFEND generator circuit in the prior art.

A circuit arrangement relating to dummy digits 12 and the RFEND generator circuit 15 in the prior art is shown in FIG. 3. This circuit is reported in "ISSCC DIGEST OF TECHNICAL PAPERS" p.p. 144–145, February, 1979.

In the dummy digit column 12, a pair of dummy digit lines $N_1$ and $N_2$ are provided on the opposite sides of a sense amplifier 13d, and MOST's $Q_3$ and $Q_5$ forming cell transistors and having their gates connected to word lines $WL_a$ and $WL_b$, respectively are connected to these dummy digit lines $N_1$ and $N_2$, respectively. The MOST's $Q_3$ and $Q_4$ are provided in equal numbers to the cell transistors in each column of a regular cell matrix and share the word lines $WL_a$ and $WL_b$ in common with the latter cell transistors, and the memory capacity of the dummy digit column 12 is also equalized with that of each column in the regular cell matrix.

Figure 4:
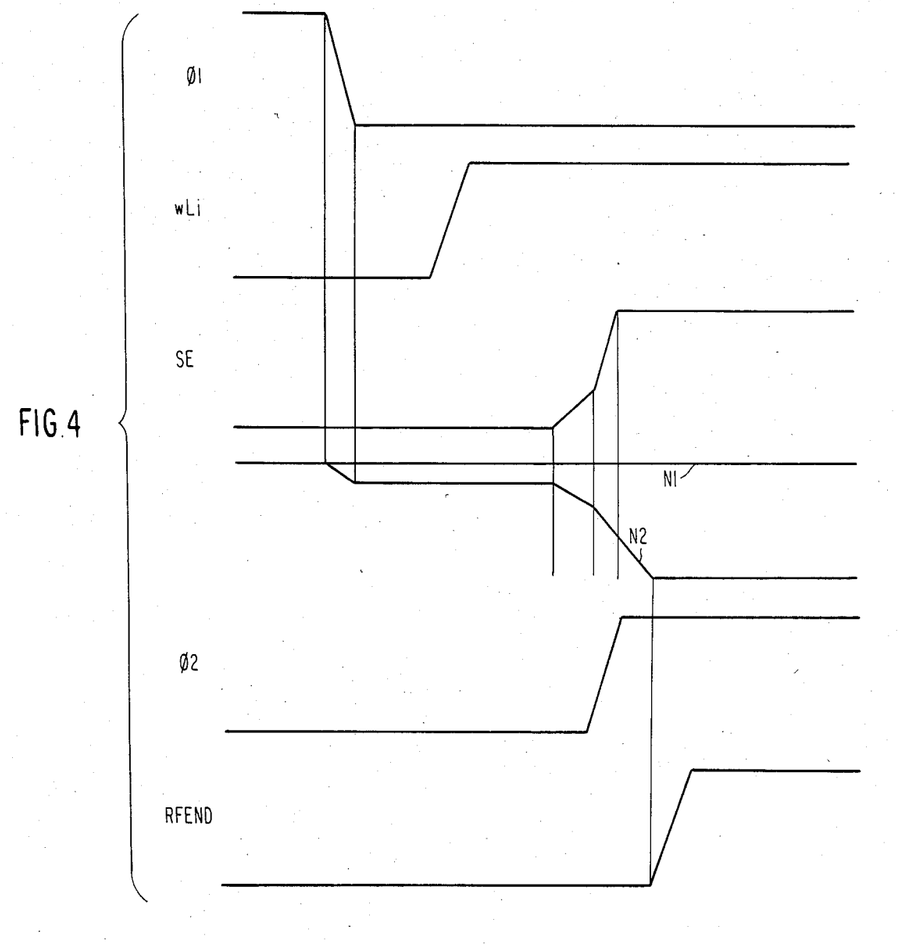
FIG. 4 is a waveform diagram to be used for explaining the operation of the circuit shown in FIG. 3.

A waveform diagram available for explaining the operation of the circuit shown in FIG. 3 is illustrated in FIG. 4. Initially, the digit lines $N_1$ and $N_2$ have been charged in advance, that is, precharged. Before a selected word line $WL_i$ rises, a timing clock $\phi_1$ would shifts from a high level to a low level. Owing to the presence of a capacitor $C_2$, the digit line $N_2$ falls in potential from the precharge potential by an amount determined by a capacitive voltage division of the digit line capacitance and the capacitance of the capacitor $C_2$. The capacitor $C_1$ connected to the digit line $N_1$ has the same capacitance as the capacitor $C_1$ in order to equalize the digit line local capacitances. Since the opposite electrode is grounded, the digit line $N_1$ is, at this moment, held at the precharge potential and not changed. Although the rise in potential of the selected word line is irrelevant to the dummy digits, activation of the sense amplifier 13d is effected in a similar manner to that for the regular cell block 11. When a latch node LN of the sense amplifier 13d is discharged through a MOST $Q_4$ in response to a rise of a clock SE, since a sufficient potential difference has been produced between the dummy digit lines $N_1$ and $N_2$ by making the timing clock $\phi_1$ at a low level, while the digit line $N_1$ is maintained at the precharge potential, the other digit line $N_2$ is made to shift to the ground potential by the sense amplifier 13. The RFEND generator circuit 15 formed of MOST's $Q_6$ to $Q_9$ responds to the lowering of the level on the digit line $N_2$ to generates the RFEND. A timing clock $\phi_2$ rises approximately at the same time as the clock SE, and when the digit line $N_2$ has become a low level and hence the MOST's $Q_7$ and $Q_8$ has become non-conducting, the timing clock $\phi_2$ acts to raise the RFEND via the MOST $Q_6$. MOST's $Q_1$ and $Q_2$ have the same dimensions as the MOST's $Q_7$ and $Q_8$, respectively, to balance the load capacitances of the digit lines $N_1$ and $N_2$, and they do not operate as functional transistors per se. When the RFEND has risen, the potential rise is transmitted to the input buffer control logic circuit 19 in FIG. 2, so that the basic clock generator circuit 18 is reset, and the memory circuit enters a precharge period as shown in FIG. 1.

Figure 5:
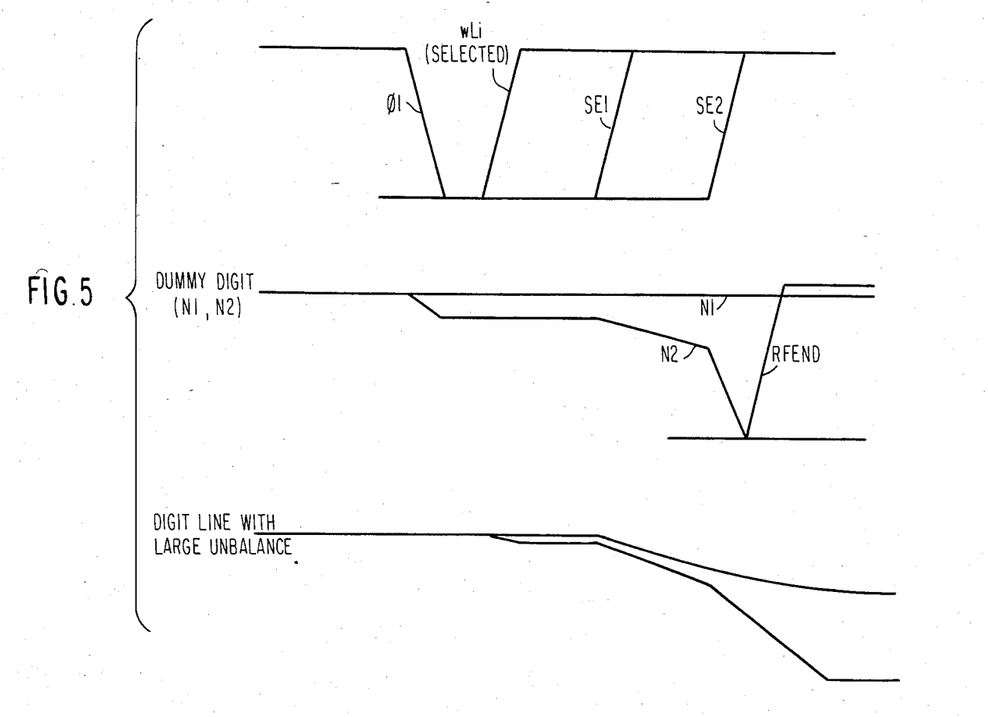
FIG. 5 is a waveform diagram to be used for explaining the problems in the RFEND generator circuit in the prior art.

The RFEND generator circuit in the prior art shown in FIG. 3 has the following problem. That is, in response to the rise of the RFEND the activation period would be terminated, and at this time point the low level on the digit line must have a sufficiently low value. It is most desirable to be perfectly equal to 0 V at the cell level, and as the cell level is raised, a margin of read operation would be cut out. As shown in FIG. 5, the dummy digit lines $N_1$ and $N_2$ are given a difference signal $V_d$ by lowering the timing clock $\phi_1$, then in response to activation of the sense amplifier 13d the digit line $N_2$ is made at a low level. As a result, the RFEND would rise. On the other hand, in the case of digit lines in a functional memory cell matrix, after a selected word line $WL_i$ has risen in potential, a memory cell signal would appear on a digit line and hence a difference voltage is produced. When the sense amplifier is activated, the difference voltage is enlarged. However, due to unbalance in digit line capacitances, and in current amplification factors $\beta$'s and threshold voltages $V_T$'s of the MOST's in a flip-flop pair of a sense amplifier for each digit, a difference would arise in the mode of enlargement of the difference voltage between the respective digits. On the paired digit lines having a large unbalance, the difference signal is cut out by the amount corresponding to the unbalance when the sense amplifier has been activated, and hence tangling would occur. As a result, transfer to a low level would be delayed as compared to the dummy digit line, and at the time point when the RFEND has risen and the activation period has terminated, there is a risk that the refreshed low level has not been sufficiently settled. In this case, upon next reading of the same cell, either an operation margin is narrowed or the operation leads to an erroneous operation.

Figure 6:
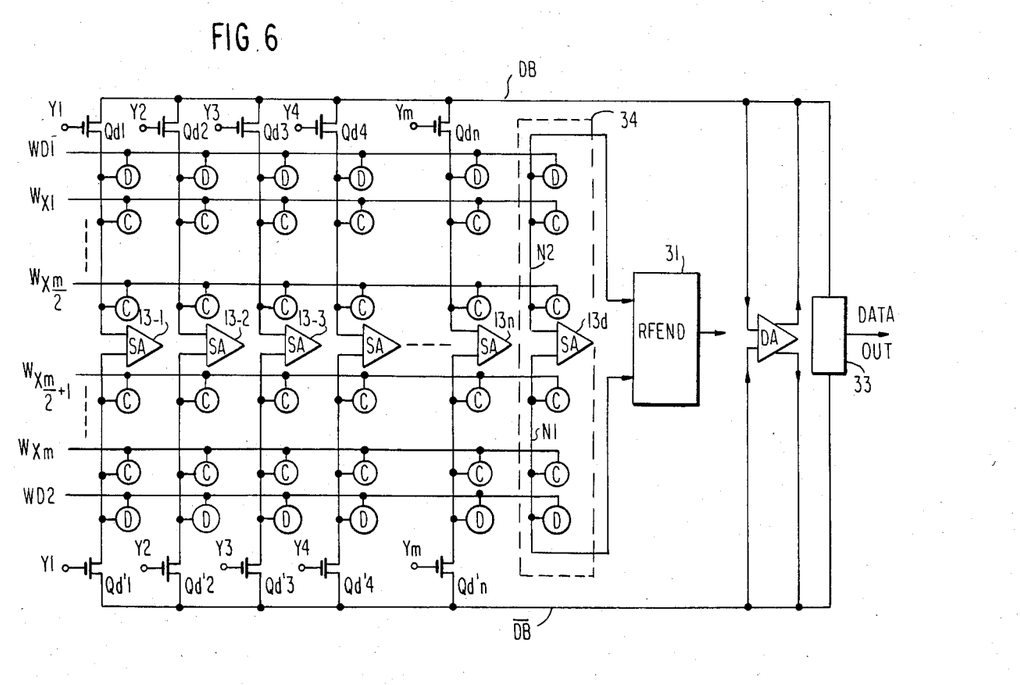
FIG. 6 shows a basic construction of a memory circuit according to the present invention.

Now a basic construction of a memory circuit according to the present invention will be explained with reference to FIG. 6. A matrix is formed by word lines $W_{x1}, \ldots, W_{xm}$, digit line pairs $(D_1, e, ovs/D/_1)$, $(D_2, \overline{D}_2), \ldots, (D_n, \overline{D}_n)$ on the both sides of n sense amplifiers (SA) 13-1, 13-2, ..., 13-n, and memory cells C disposed at the respective cross-points of this matrix. In addition, dummy word lines $W_{D1}$ and $W_{D2}$ are disposed on the opposite sides of the sense amplifiers 13-1, ... 13-n in parallel to the word lines $W_{x1}, \ldots, W_{xm}$, and dummy cells D are disposed at the cross-points between these dummy word lines $W_{D1}$ and $W_{D2}$ and the respective digit lines. The dummy cells D are used to set a potential on the digit line at a reference potential. In a dummy digit column 34, similarly to the normal cell array, dummy digit lines $N_1$ and $N_2$ are disposed on the opposite sides of an additional sense amplifier 13d, and memory cells C and dummy cells D are disposed at the cross-points between these dummy digit lines $N_1$ and $N_2$ and the respective word lines and dummy word lines, respectively.

The digit lines $(D_1, \overline{D}_1), (D_2, \overline{D}_2), \ldots, (D_n, \overline{D}_n)$ are connected via selection MOST's $Q_{d1}, Q_{d'1}, Q_{d2}, Q_{d'2}, \ldots, Q_{dn}, Q_{d'n}$ which are selected by the outputs $Y_1, Y_2, \ldots, Y_m$ of a column (Y) decoder, to data buses $(D_B, \overline{D}_B)$ connected to a data latch amplifier 32 and an output buffer 33. In the dummy digit column 34, there is no such circuit arrangement to be connected to the data buses $(D_B, \overline{D}_B)$.

The activation signals for the word line and the sense amplifier 13d in the dummy digit column 34 in the circuit 30 newly added according to the present invention are shared in common with the normal cell block. In the normal cell block, in response to activation of one of the Y-decoder outputs $Y_1, Y_2, \ldots, Y_n$, the information stored in the selected cell is amplified on the digit lines by the sense amplifier SA, and then transmitted through the MOST's $Q_{di}$ and $Q_{d'i}$ forming the selected decoder switches to the data input/output buses $(D_B, \overline{D}_B)$. The read data are further amplified on the data input/output buses by the data latch amplifier (DA) 32 and then transmitted to the output buffer 33. Subsequently, the output buffer 33 is activated and the data are obtained at its output terminal (DATA OUT). When a selected word line (including a dummy word line) rises in potential, in the dummy digit column 34 also, information stored in a cell C and a reference potential from a dummy cell D appear on the digit lines $N_1$ and $N_2$, respectively. If the sense amplifiers SA are activated, the sense amplifier $13d$ for the dummy digit column would operate in a similar manner to that in the functional memory matrix. When the sense amplifier $13d$ has sufficiently amplified the potential difference between the digit lines $N_1$ and $N_2$, the RFEND is generated from a RFEND generator circuit 31 which has both the true and complementary digit lines $N_1$ and $N_2$ of the dummy digit 34 connected to its inputs. In other words, the circuit construction is such that the RFEND may be activated after one of the dummy digit lines has become a sufficiently low level. Since the Y-decoder switches are not connected to these digit lines but instead the digit lines lead to the inputs of the RFEND generator circuit 31, the load capacitances of these dummy digit lines are equal to or somewhat larger than those of the digit lines in the functional memory matrix. In order to forcibly make the condition for sense operation of the dummy digit column rather bad, it is only necessary to realize balancing of the load by connecting MOST's corresponding to the Y-decoder switches to the dummy digit lines so as to be inoperable. In this case, transfer of the dummy digit line to a low level becomes somewhat delayed with respect to that of the normal digit line, and hence, the condition that at the time point when the RFEND rises, the ones at the lower level in all the digit line pairs $(D_1, \overline{D}_1), (D_2, \overline{D}_2), \ldots, (D_n, \overline{D}_n)$ in the normal cell block should have a sufficiently low value, can be fulfilled almost in every case. Even if an erroneous operation should occur in the dummy digit column, after activation of the sense amplifier either one of the digit lines always transfers to a low level, and hence no trouble would occur in the generation of the RFEND.

Figure 7:
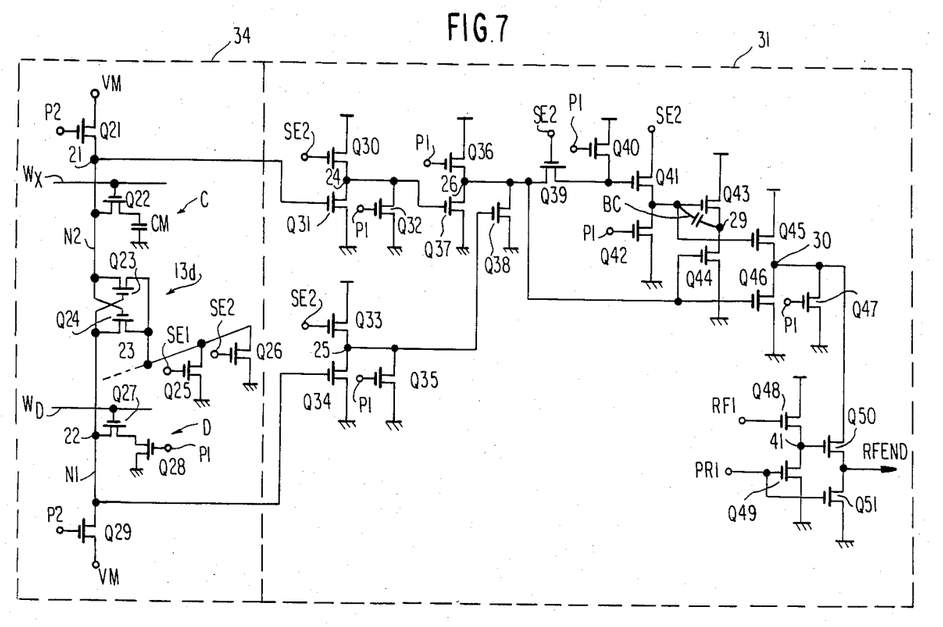
FIG. 7 shows one preferred embodiment of the present invention.
Figure 8:
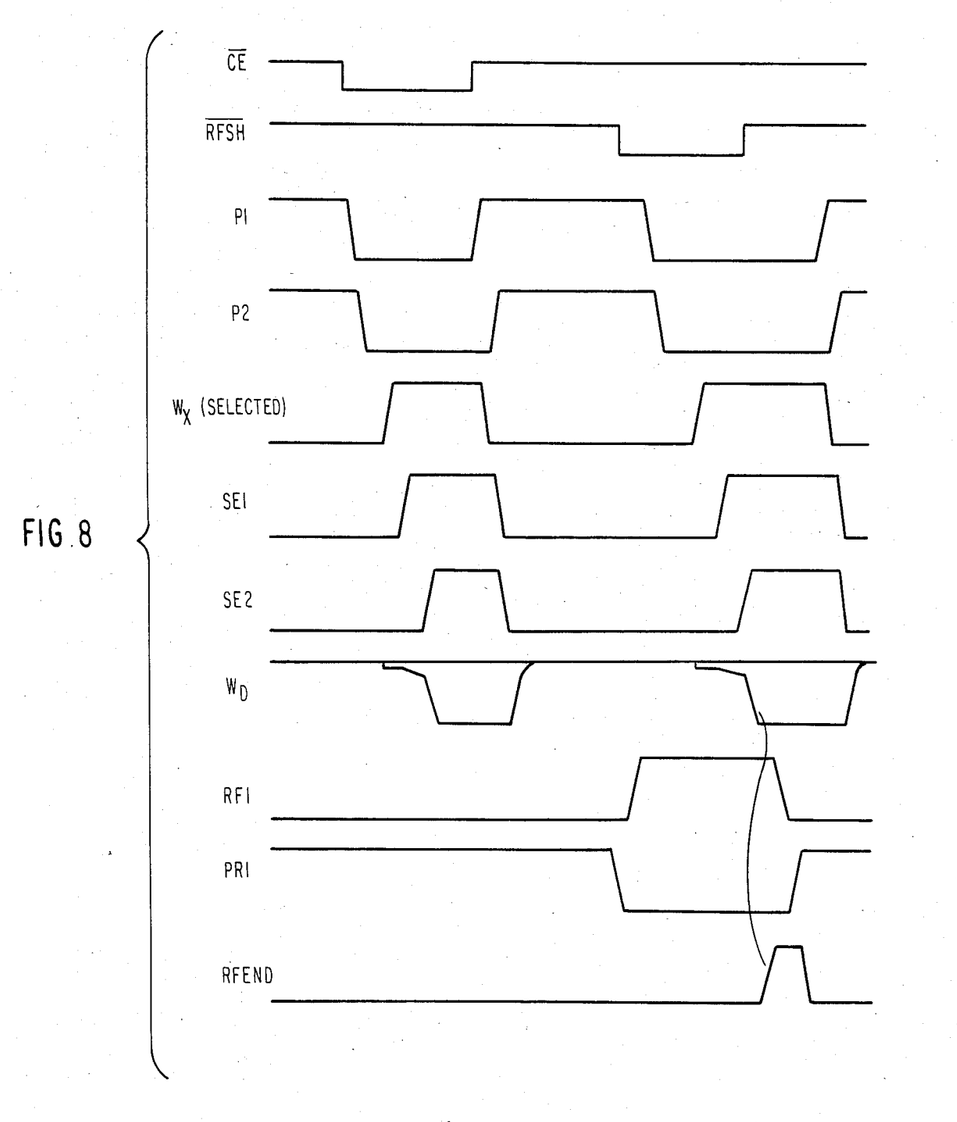
FIG. 8 shows principal timing signals and waveforms at various nodes appearing in the circuit shown in FIG. 7.

A detailed circuit arrangement of one preferred embodiment of the present invention is illustrated in FIG. 7, and waveforms of principal timing clocks and signals appearing at various nodes in FIG. 7 are shown in FIG. 8.

As shown in FIG. 7, in the dummy digit column 34, in response to a precharge timing $P_2$ MOST's $Q_{21}$ and $Q_{29}$ precharge the dummy digit lines $N_1$ and $N_2$ up to a potential $V_M$. A memory cell C is formed of a MOST $Q_{22}$ having its gate connected to a word line $W_x$ and a capacitor $C_n$. A dummy cell D is formed of a MOST $Q_{27}$ having its gate connected to a dummy word line $W_D$ and a MOST $Q_{28}$ connected between the MOST $Q_{27}$ and the ground and having a precharge triming $P_1$ applied to its gate. MOST's $Q_{23}$ and $Q_{24}$ form the sense amplifier $13d$, and between a latch node 23 of the sense amplifier $13d$ and the ground are connected latch control MOST's $Q_{25}$ and $Q_{26}$ in parallel to each other.

In a RFEND generator circuit 31, an inverter having the level on the dummy digit line $N_2$ applied to its input and issuing an output at a node 24 is formed by MOST's $Q_{30}$ to $Q_{32}$, and another inverter having the level on the dummy digit line $N_1$ applied to its input and issuing an output at a node 25 is formed by MOST's $Q_{33}$ to $Q_{35}$. MOST's $Q_{36}$ and $Q_{38}$ form an NOR circuit using the nodes 24 and 25 as its input points and a node 26 as its output point. MOSFET's $Q_{39}$ to $Q_{47}$ form a boot-strap type inverter having the output point 26 of the NOR circuit connected to its input, and an output node 30 of the boot-strap type inverter is connected to a drain of an output stage MOST $Q_{50}$ of a push-pull circuit formed of MOST's $Q_{48}$ to $Q_{51}$ and having a signal PR1 applied to its input. The RFEND is generated from this output stage.

Now the operation of the circuit shown in FIG. 7 will be described with reference to FIG. 8. As will be seen from FIG. 8, the memory circuit is a PSRAM employing a basic clock $\overline{CE}$ and a refresh control clock $\overline{RFSH}$, in which the same input timing as that shown in FIG. 1 is established. While the $\overline{RFSH}$ is inactivated, that is, at a high level, when the $\overline{CE}$ is activated, then the normal operation cycles such as read and write cycles for data are executed. More particularly, when the $\overline{CE}$ transfers to a low level, the precharge timings $P_1$ and $P_2$ successively fall to the ground potential, while the digit lines in the cell block as well as the dummy digit lines are held in a high impedance state at the $V_M$ level. Then, the nodes 24 and 25 of the RFEND generator circuit 31 are respectively maintained at the ground potential by the MOST's $Q_{31}$ and $Q_{34}$ having this precharge level $V_M$ on the dummy digit lines applied to their gates. Therfter, a selected word line $W_x$ rises in potential, hence information stored in the selected memory cells appear on the digit lines of the functional memory matrix and on the dummy digit lines, subsequently activation timings $SE_1$ and $SE_2$ for the sense amplifiers rise successively, and the read information is amplified on the digit lines. Then, a read/write selection signal is applied externally, hence selected true and complementary digit lines of the cell block are connected via the Y-decoder switches to the input/output data buses, and thereby a read or write operation is effected. In the dummy digit column also, activation of the sense amplifier is effected simultaneously, and as described previously, a rather delayed amplification operation with respect to the normal cell block is effected. Here, it is assumed that the node 22 on the dummy digit line $N_1$ shifts to a low level while the node 21 on the dummy digit line $N_2$ is maintained at a high level. In response to the rise of the $SE_2$, the MOST's $Q_{31}$ and $Q_{33}$ become conducting. However, since the MOST $Q_{31}$ is given a far larger current capability than the MOST $Q_{30}$ and the MOST $Q_{34}$ is given a far larger current capability than the MOST $Q_{23}$, and since the node 21 is held at a high level, the node 24 is maintained at a low level. When the node 22 has transferred to a low level and the MOST $Q_{14}$ has become non-conducting, the node 25 rises in potential, and the node 26 is discharged through the MOST $Q_{38}$. The node 28 has been already charged by the $SE_2$, hence when the MOST $Q_{44}$ becomes non-conducting due to the discharge of the node 26, the level at the node 28 is raised further owing to a boot-strap capacitance BC, and thus drives the MOST's $Q_{43}$ and $Q_{45}$ into an unsaturated region. As a result, the node 30 rises up to the power supply level. During the period when the $\overline{RFSH}$ is at a high level, a timing $PR_1$ which serves as a precharge timing for internal refresh is held at a high level, and a timing $RF_1$ which serves as an activation timing for internal refresh is held at the ground potential. Accordingly, although the node 30 rises, the node 31 and the RFEND are maintained, at this moment, at the ground potential. When the $\overline{CE}$ is returned to a high level, the memory circuit is reset, and subsequently a precharge operation is effected.

After the necessary precharge period has been terminated, an internal refresh operation is executed by activating the $\overline{RFSH}$ while maintaining the $\overline{CE}$ at a high level. When the $\overline{RFSH}$ has transferred to a low level, the $\overline{PR}_1$ changes to the ground potential and subsequently the $\overline{RF}_1$ rises. In response to these potential changes, the input buffer control logic circuit 19 operates to actuate the basic clock generator circuit 18 in FIG. 2. Hence, a refresh operation for the cells at the addresses designated by the refresh address counter 20 is effected. Up to the time when the word line rises and the sense amplifiers are activated, the operation is identical to the abovedescribed case where the $\overline{CE}$ was activated, but in this case the Y-decoder is not activated, so that the input/output buses and the subsequent stages are maintained in the precharge state. Memory information is amplified on the dummy digit lines simultaneously with or somewhat later than the digit lines of the cell block, and assuming that the node 22 changes towards a low level, the node 30 would rise through the above-mentioned process. However, in this case the node 31 has been precharged by the $RF_1$, hence the potential rise at the node 30 is immediately transmitted to the RFEND because the MOST $Q_{50}$ is driven to an unsaturated region. As soon as the RFEND rises, the internal refresh timings are reset, and the $PR_1$ rises after the $RF_1$ has transferred to the ground potential. This level changes of the refresh timings $PR_1$ and $RF_1$ are transmitted to the input buffer control logic circuit 19 in FIG. 2, hence the basic clock generator circuit 18 is reset, and the memory circuit enters a precharge period. The activation period for the internal refresh is automatically terminated by the rise of the RFEND as described previously, and the timing of resetting the $\overline{RFSH}$ to a high level is irrelevant to the termination of the activation period. To the nodes 21 and 22 on the dummy digit lines are additionally connected MOST's $Q_{31}$ and $Q_{34}$ as compared to the digit lines of the cell block, and moreover there exist wirings for connecting the nodes to these MOST's. Therefore, the load capacitances for these nodes 21 and 22 are increased by the corresponding amount. Accordingly, the operating condition of the sense amplifier 13d for the dummy digit lines becomes rather severe. Hence, the transfer to a low level of the sense amplifier 13d upon activation is somewhat delayed with respect to that of the sense amplifiers 13-1 to 13-n. Therefore, at the time point when the RFEND has risen and the activation period has ended, the refreshed levels on the digit lines of the cell block would take logically well defined values.

Figure 9:
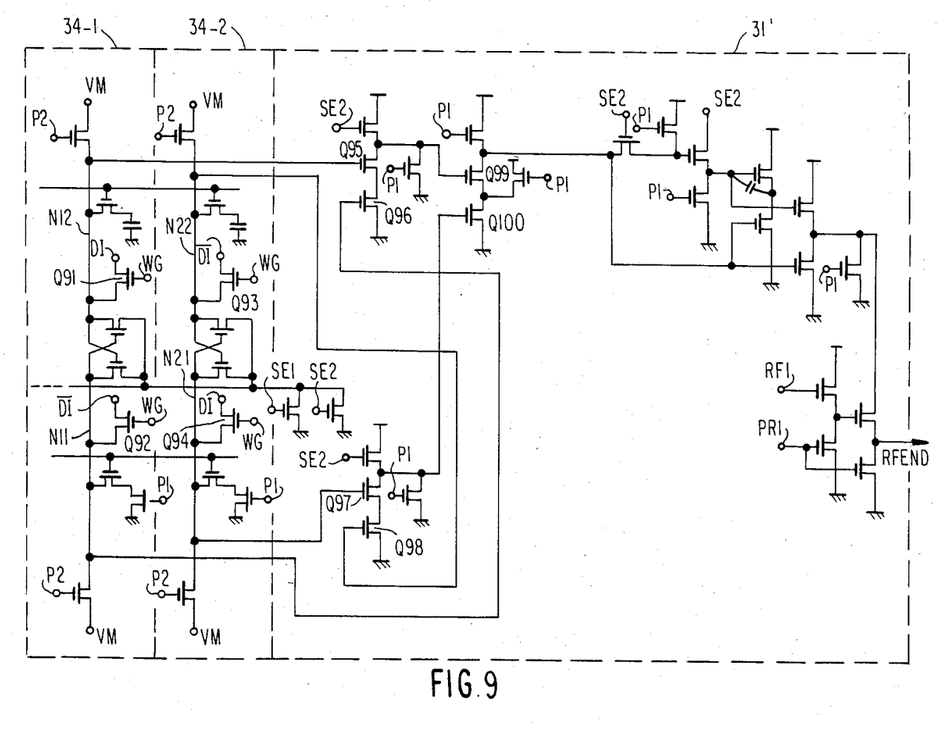
FIG. 9 shows another preferred embodiment of the present invention.

Another preferred embodiment of the present invention is illustrated in FIG. 9. The only difference from the first preferred embodiment shown in FIG. 7 exists in that two dummy digit columns 34-1 and 34-2 are provided. Hence four dummy digit lines $N_{11}$, $N_{12}$, $N_{21}$ and $N_{22}$ in total which are complementary to each other are connected to input points of a RFEND generator circuit 31', and gate MOST's $Q_{91}$ and $Q_{94}$ for writing opposite information contents to the respective dummy digit columns are connected to the dummy digit lines. In this modified embodiment, in the RFEND generator circuit 31', MOST's $Q_{95}$ and $Q_{96}$ form a first NAND circuit receiving the levels on the dummy digit lines $N_{11}$ and $N_{12}$ as its inputs. MOST's $Q_{97}$ and $Q_{98}$ form a second NAND circuit receiving the levels on the digit lines $N_{21}$ and $N_{22}$. MOST's $Q_{99}$ and $Q_{100}$ form another NAND circuit receiving the output of the first NAND circuit and the output of the second NAND circuit. In the case of the embodiment shown in FIG. 7, since no write gate is provided for the dummy column, the levels determined by chance upon switch-on of the power supply are retained in themselves on the respective cells in the dummy digit column. If there exists a difference in a read operation margin between a cell at a high level and a cell at a low level, it is desirable that the RFEND should rise after the result of reading for the cell having a more severe read operation margin has been obtained. In the embodiment shown in FIG. 9, in every write cycle a high level is written in one of the two dummy digit columns and a low level is written in the other dummy digit column. In this modified RFEND generator circuit, a logic construction is employed such that among the dummy digit lines which are predetermined to read a high level and a low level, respectively, after the dummy digit lines which transfer to a low level more slowly have been fully lowered in potential the RFEND can rise. Accordingly, in this modified embodiment, the above-described requirement can be fulfilled.

As described in detail above, according to the present invention, the refresh operation end confirmation signal RFEND which is necessitated in the case where refresh is made to occur automatically within a chip, can be made to rise after activation operations of the respective sense amplifiers in the cell block have been fully executed, and therefore, the present invention is very effective in the case where confirmation of termination of sense amplifier operations is necessary for generating internal timing clocks, not only in a PSRAM but also in a large capacity dynamic RAM.

I claim:

1. A memory circuit comprising a memory cell array including a plurality of memory cells arrayed in rows and columns; a dummy array including a plurality of memory cells arrayed in rows and a dummy column, the rows of said dummy array being electrically common to the rows of said memory cell array; each of said columns including a pair of digit lines, a plurality of sense amplifiers each provided for the respective columns of said memory cell array and said dummy column, each of said sense amplifier having a pair of input terminals adapted to be connected to a pair of digit lines included in the associated column; control means for enabling said sense amplifiers simultaneously thereby to make a potential of one of each pair of digit lines at a low level and a potential of the other of each pair of digit lines at a high level; detection means coupled to both of the digit lines of said dummy column for detecting that a potential at either of the digit lines of said dummy column becomes the low level, and means responsive to said detection means for generating a signal indicating that refresh operation by said sense amplifiers is achieved.

2. The circuit according to claim 1, in which said detection means includes a first inverter having an input terminal receiving a potential of one of the digit lines of said dummy column, a second inverter having an input terminal receiving a potential of the other of the digit lines of said dummy column.

3. The circuit according to claim 2, in which said generating means includes a NAND circuit receiving output signals of said first and second inverters.

4. A memory circuit comprising a plurality of memory cells arrayed in rows and columns, a sense amplifier for each column, a true digit line and a complement digit line for each sense amplifier, the memory cells in each column being connected to at least one of the respective digit lines when the respective memory cells are enabled in a selected row thereby to cause a difference in potential between the true and complement digit lines in the same column, control means for operatively enabling said sense amplifiers thereby to make a potential at one of the true and complement digit lines at a low level and a potential at the other of the true and complement digit lines at a high level, a first detection circuit coupled to the true digit line of one of said columns for detecting that a potential thereof becomes said low level, a second detection circuit coupled to the complement digit line of said one of said columns for detecting that a potential thereof becomes said low level, column selection means for selecting the remainder of said columns other than said one of said columns, output means for outputing data from the selected column by said column selection means, and signal generating means coupled to said first and second detection circuits for generating a refresh end confirmation signal indicating that said sense amplifiers achieve their amplifying operations.

5. The circuit according to claim 4, in which each of said first and second detection circuits includes an inverter.

6. The circuit according to claim 4, further comprising means responsive to said refresh end confirmation signal for introducing a precharge cycle to the memory circuit.

7. The circuit according to claim 4, further comprising means for receiving a refresh control signal and means responsive to said refresh control signal for performing a refresh operation.

8. A memory circuit comprising a cell matrix including dynamic type memory cells arrayed in rows and columns and a plurality of sense amplifiers each for the respective columns; a dummy array having the same rows as those of said cell matrix, memory cells arrayed in the rows and at least one column, and at least one sense amplifier adapted to be enabled simultaneously with the sense amplifiers of said cell matrix; detection means coupled to the column of said dummy array for detecting that the sense amplifier of said dummy array perfects its amplification operation, and means responsive to an output of said detection means for generating a signal indicating completion of a refresh operation.

* * * * *

UNITED STATES PATENT AND TRADEMARK OFFICE
CERTIFICATE OF CORRECTION

PATENT NO. : 4,500,974
DATED : February 19, 1985
INVENTOR(S) : Akira NAGAMI

It is certified that error appears in the above-identified patent and that said Letters Patent is hereby corrected as shown below:

Column 6, line 25, after "$D_1$", delete "e,ovs/$D_1'$)", and insert -- $\bar{D}_1$) --.

Column 9, line 50, "and", second occurrence, should read -- to --.

Signed and Sealed this

Seventeenth Day of September 1985

[SEAL]

Attest:

DONALD J. QUIGG

Attesting Officer

Commissioner of Patents and
Trademarks—Designate